(12) United States Patent
Shah et al.

(10) Patent No.: US 12,200,332 B1
(45) Date of Patent: Jan. 14, 2025

(54) CAMERA MODULE PARTICLE CAPTURE BY STICKY DUST TRAP EPOXY

(71) Applicant: Apple Inc., Cupertino, CA (US)

(72) Inventors: Paulom Shah, San Jose, CA (US); Bumsuk Kim, Suseong-gu (KR); Yunfeng Li, Fremont, CA (US)

(73) Assignee: Apple Inc., Cupertino, CA (US)

( * ) Notice: Subject to any disclaimer, the term of this patent is extended or adjusted under 35 U.S.C. 154(b) by 169 days.

(21) Appl. No.: 17/934,172

(22) Filed: Sep. 21, 2022

Related U.S. Application Data

(60) Provisional application No. 63/248,403, filed on Sep. 24, 2021.

(51) Int. Cl.
| | | |
|---|---|---|
| *H04N 23/52* | (2023.01) | |
| *G06T 7/00* | (2017.01) | |
| *H01L 27/146* | (2006.01) | |
| *H04N 23/50* | (2023.01) | |

(52) U.S. Cl.
CPC ........... *H04N 23/52* (2023.01); *G06T 7/0002* (2013.01); *H01L 27/14618* (2013.01); *H04N 23/50* (2023.01); *G06T 2207/10048* (2013.01); *G06T 2207/20081* (2013.01); *G06T 2207/30168* (2013.01)

(58) Field of Classification Search
None
See application file for complete search history.

(56) References Cited

U.S. PATENT DOCUMENTS

| | | |
|---|---|---|
| 7,726,889 B2 | 6/2010 | Tenmyo |
| 8,243,184 B2 | 8/2012 | Kawai |
| 9,274,334 B2 | 3/2016 | Luo |
| 2010/0025792 A1* | 2/2010 | Yamada ................. H04N 23/55 257/E31.127 |
| 2015/0334277 A1 | 11/2015 | Liu |
| 2019/0346356 A1* | 11/2019 | Karnik ............... G01N 15/1433 |
| 2020/0336639 A1* | 10/2020 | Hu ......................... G03B 30/00 |

* cited by examiner

*Primary Examiner* — Christopher Braniff
(74) *Attorney, Agent, or Firm* — Robert C. Kowert; Kowert, Hood, Munyon, Rankin & Goetzel, P.C.

(57) ABSTRACT

A camera module with sticky epoxy and method for dislodging particles from a corresponding IR filter. Particles, formed during manufacture or use of the camera, may accumulate in the camera (e.g., on an infrared filter) causing blemishes in camera images. A sticky epoxy with characteristics for attracting and capturing particles is located in the camera. The epoxy may be located in a gap between a substrate and an outside edge of an infrared filter coupled to the substrate. The epoxy and the gap may surround the infrared filter and the epoxy may also be located on other surfaces of the camera. A process for loosening particles from the infrared filter includes driving an actuator that moves the substrate/infrared filter assembly (perhaps striking a base assembly) to loosen the particles from the infrared filter such that the particles are moved to, and trapped by, the epoxy.

20 Claims, 8 Drawing Sheets

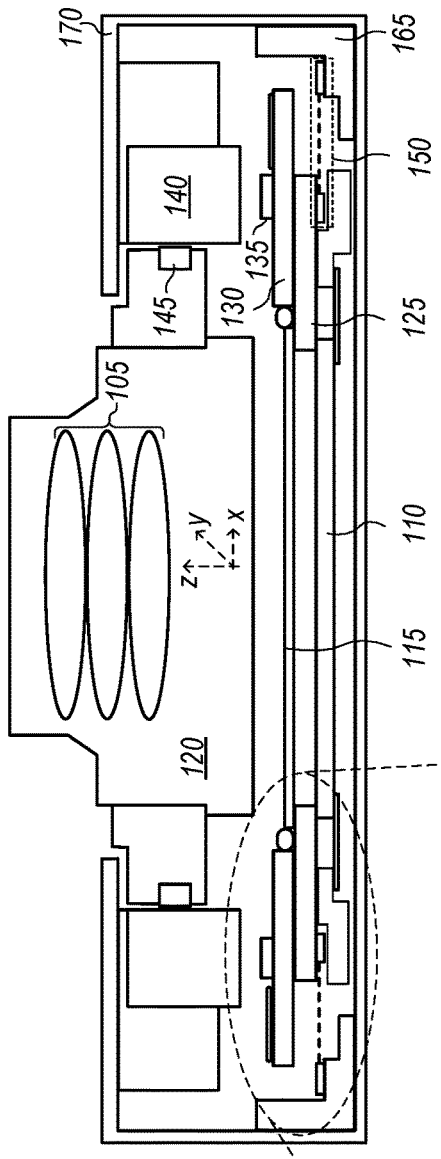
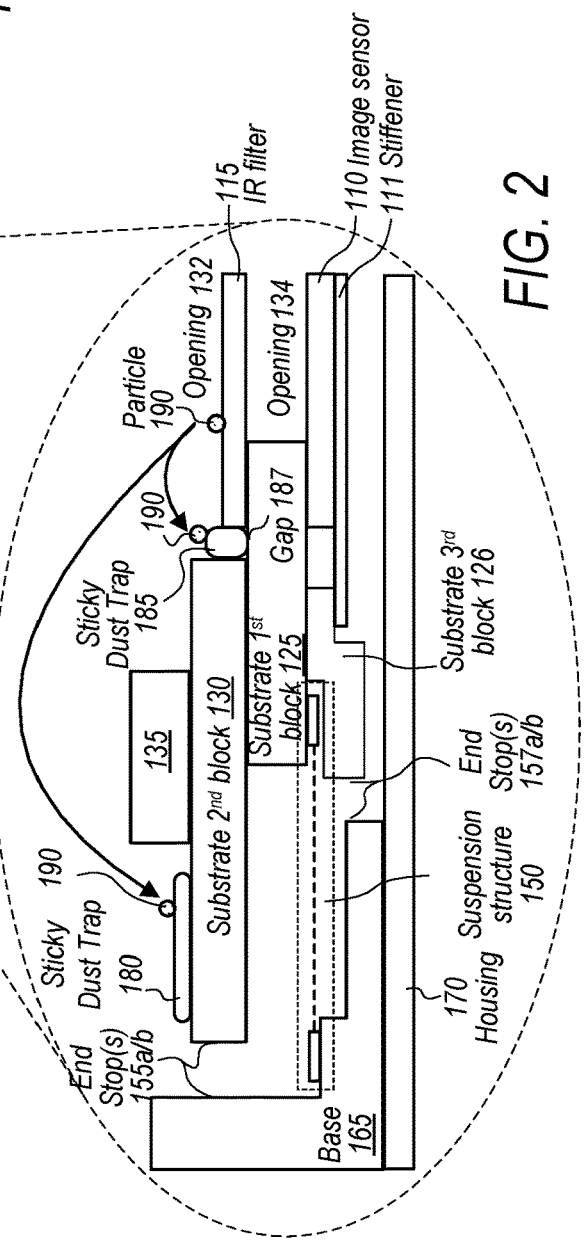
FIG. 1
FIG. 2

CAMERA MODULE PARTICLE CAPTURE BY STICKY DUST TRAP EPOXY

This application claims benefit of priority to U.S. Provisional Application Ser. No. 63/248,403, entitled "Camera Module Particle Capture by Sticky Dust Trap Epoxy," filed Sep. 24, 2021, and which is hereby incorporated herein by reference in its entirety.

BACKGROUND

Technical Field

This disclosure relates generally to dust traps and epoxy for particle capture in camera modules, as well as a process for loosening particles from an infrared filter.

Description of the Related Art

The advent of small, mobile multipurpose devices such as smartphones and tablet or pad devices has resulted in a need for high-resolution, small form factor cameras for integration in the devices.

Particles (dust, metal, organics, etc.) generated during manufacture of the camera, or during use of the camera may become located on or adhere to, an infrared filter of the camera, causing blemishes in images obtained via the image sensor of the camera. Particles can result in a low contrast blemish or a defect pixel on image sensor, degrading image quality for end customer. Once camera assembly is finished, no mechanism exists to dislodge or remove the particle.

BRIEF DESCRIPTION OF THE DRAWINGS

FIG. 1 illustrates a cross-sectional view of a camera, in accordance with some embodiments.

FIG. 2 illustrates a zoomed view of the cross-sectional view of the camera, in accordance with some embodiments.

Figure 3A:
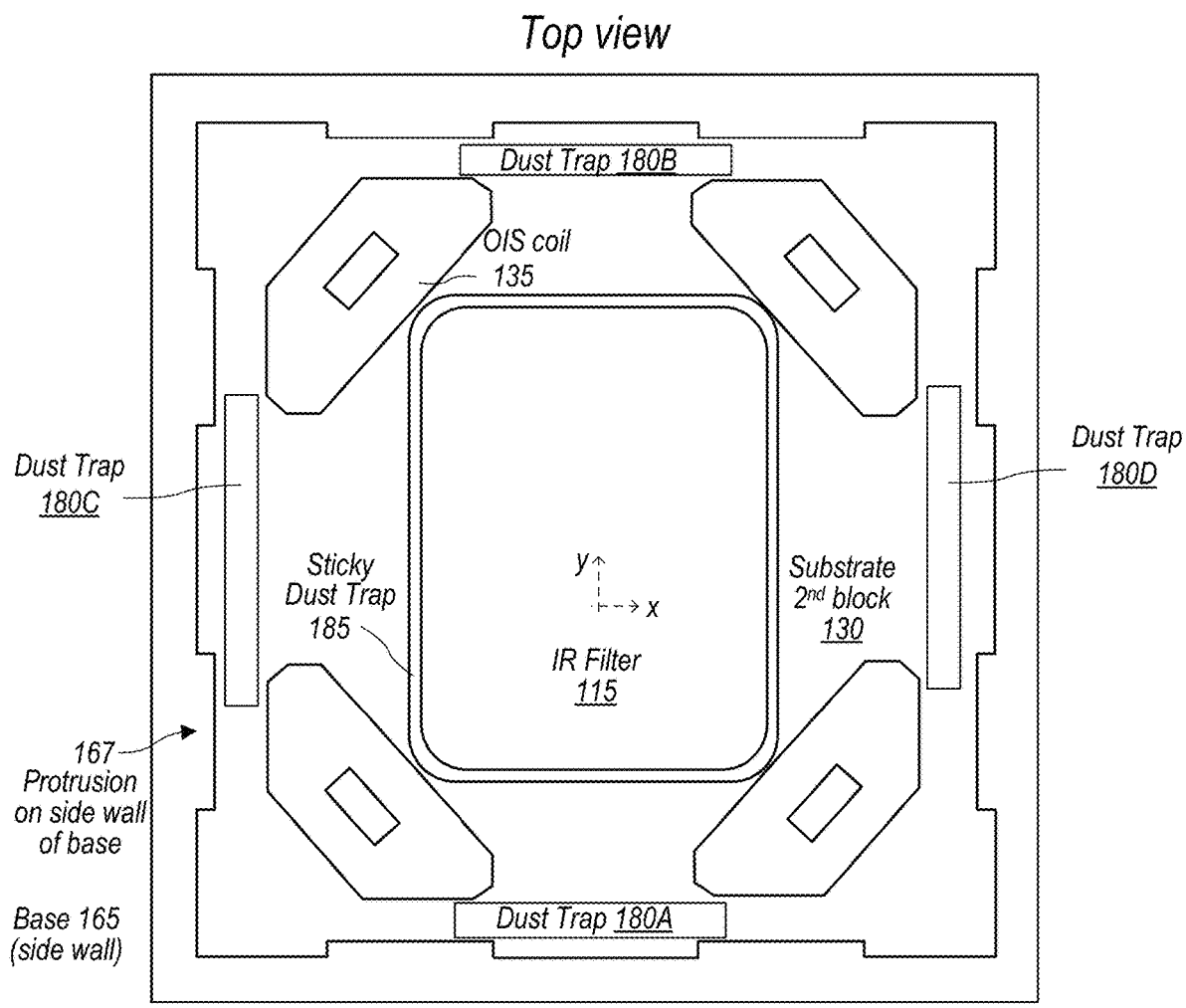
FIG. 3A illustrates a top-down view of components of a camera, in accordance with some embodiments.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

"Comprising." This term is open-ended. As used in the appended claims, this term does not foreclose additional structure or steps. Consider a claim that recites: "An apparatus comprising one or more processor units . . . " Such a claim does not foreclose the apparatus from including additional components (e.g., a network interface unit, graphics circuitry, etc.).

"Configured To." Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. § 112 (f) for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configure to" may also include adapting a manufacturing process (e.g., a semiconductor fabrication facility) to fabricate devices (e.g., integrated circuits) that are adapted to implement or perform one or more tasks.

"First," "Second," etc. As used herein, these terms are used as labels for nouns that they precede, and do not imply any type of ordering (e.g., spatial, temporal, logical, etc.). For example, a buffer circuit may be described herein as performing write operations for "first" and "second" values. The terms "first" and "second" do not necessarily imply that the first value must be written before the second value.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the intended scope. The first contact and the second contact are both contacts, but they are not the same contact.

The terminology used in the description herein is for the purpose of describing particular embodiments only and is not intended to be limiting. As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

DETAILED DESCRIPTION

A camera module with sticky dust trap epoxy and a method for dislodging particles from an infrared filter of the camera is disclosed. Particles, formed during manufacture or use of the camera, may accumulate in the camera (e.g., on an infrared filter) causing blemishes in camera images. A sticky epoxy, different from assembly epoxy, may be located on interior surfaces of the camera to permanently capture particles, preventing the particles from moving to the infrared filter or onto the image sensor.

One possible solution is to apply, to the interior space of the camera, a sticky epoxy with characteristics for attracting and capturing particles. The sticky epoxy may be located on any of various surfaces of the interior of the camera, but preferably so as not to interfere with movement of the interior components and/or preferably located near to areas of the camera interior that generate such particles. For example, the sticky epoxy may be located in a gap between a substrate and an outside edge of an infrared filter coupled to the substrate. The sticky epoxy and the gap may surround the infrared filter, and the sticky epoxy may also be located on other surfaces of the camera, such as, but not limited to other areas on the substrate.

In embodiments, a sticky resin, as used herein, may refer to a material having various combinations of characteristics. In some non-exhaustive examples, the sticky resin may be an epoxy or acrylic resin compound, may exhibit low viscosity, may exhibit an adhesive characteristic (with an adhesive force sufficient to trap and hold dust particles, such as but not limited to, micro dust) after curing (without hardening, in some embodiments) and/or may exhibit very little, if any, bleeding runs. In some embodiments, the sticky resin is a quick-drying dust trap agent for catching micro dust. The agent may be applied as a thin adhesive film on the surface of the work (a substrate or similar) for example. In embodiments, the adhesion performance of the agent (the sticky resin) lasts for a period of time akin to an expected lifetime of use of the product.

While embodiments are generally described herein as using a sticky epoxy, it should be understood that the description equally applies to other sticky resins, not just epoxies.

Various processes may be performed by the camera to loosen the particles from undesirable attachment to various surfaces. For example, a process for loosening particles from the infrared filter includes driving an actuator that moves a substrate/infrared filter assembly (perhaps, but not necessarily with enough force to strike an end stop of base assembly with an end stop of the substrate/infrared filter assembly) to loosen the particles from the infrared filter such that the particles are moved off of the IR filter, towards, and eventually onto the sticky epoxy, where the particles are trapped by the stickiness of the sticky epoxy.

In embodiments, the sticky epoxy is an epoxy with different characteristics from epoxy used to assemble components of the camera. For example, an assembly epoxy used to assemble substrate bodies together, or to attach an image sensor or an infrared filter to a substrate may be an epoxy of a type that does not exhibit stickiness after final assembly, while the sticky epoxy may be of a type that does retain a sticky characteristic after final assembly. The sticky epoxy may exhibit other characteristics. For example, some epoxies that exhibit a stickiness may also exhibit flow or partial-flow characteristics. A sticky epoxy that exhibits, after final assembly, a stickiness while minimizing flow characteristics may be used in some embodiments.

Reference will now be made in detail to embodiments, examples of which are illustrated in the accompanying drawings. In the following detailed description, numerous specific details are set forth in order to provide a thorough understanding of the present disclosure. However, it will be apparent to one of ordinary skill in the art that some embodiments may be practiced without these specific details. In other instances, well-known methods, procedures, components, circuits, and networks have not been described in detail so as not to unnecessarily obscure aspects of the embodiments.

FIG. 1 illustrates a cross-sectional view of a camera, in accordance with some embodiments. For purposes of illustration, only relevant components are included in the figures. Furthermore, a coordinate system defined by X-Y-Z axes is also shown in the figures, and an optical axis of lenses 105 is defined as the Z-axis. In some embodiments, the optical axis may correspond to the transmission path of a principal light ray passing through lenses 105 to image sensor 110. In some embodiments, the transmission path of the principal light ray within camera 100 may not necessary be a straight but rather a folded line, e.g., when camera 100 includes a light folding element as part of the one or more lenses that may change the transmission direction of the principal light ray. In that case, the optical axis may refer to any straight part of the folded line. FIG. 2 is a zoomed view of a portion of the camera to further illustrate details of the dust trap features. As indicated in FIG. 1, camera 100 may include one or more lenses 105 and an image sensor 110. Lenses 105 may pass through light on to image sensor 110 that may accordingly generate image signals. The image signals may be processed by a processor (e.g., processor 502 or 620, described below) to produce an image. In some embodiments, camera 100 may include infrared filter (IRF) 115 placed between optical lenses 105 and image sensor 110 to block or reduce infrared light from reaching image sensor 110.

In this example, both lenses 105 and image sensor 110 may be movable relative to one another. For instance, lenses 105 may be contained inside lens holder 120, and camera 100 may include a suspension structure (not shown) that suspends lens holder 120 from a stationary part of camera 100, e.g., housing 170 of camera 100. The suspension structure may allow lenses 105 (and lens holder 120) to move relative to image sensor 110 in a direction in parallel to the optical axis of lenses 105 (e.g., approximately along Z-axis) to perform autofocus (AF). In addition, image sensor 110 and infrared filter 115 may be affixed to a substrate. In this example, the substrate may include a first substrate block 125, a second substrate block 130, and a third substrate block 126, three of which may be joined together. In some embodiments, the structure formed by the three illustrated substrate blocks may be formed as a single block or as a set of blocks.

Infrared filter 115 may be attached to a top side of substrate first block 125 facing lenses 105, whilst image sensor 110 may be affixed to an underneath side of substrate first block 125 facing away from lenses 105. Substrate first block 125 may include an opening at the position over image sensor 110 to allow light passing through infrared filter 115 to reach image sensor 110. Further, substrate second block 130 may be used to hold other components and/or route electrical signals from and/or to image sensor 110. For instance, in some embodiments, substrate first block 125 may be a ceramic substrate, whilst substrate block 130 may be an organic substrate (e.g., a printed circuit board or PCB). Note that, in some embodiments, the substrate may be implemented as one single piece, rather than separate blocks joined together.

The substrate and image sensor 110 may be suspended from a stationary part of camera 100, e.g., stationary base structure 165 (that may be further affixed with housing 170), using suspension structure 150. For instance, suspension structure 150 may include an inner frame and an outer frame, two of which may be connected through multiple flexure arms. The inner frame of suspension structure 150 may be affixed to substrate first block 125, whilst the outer frame of suspension structure 150 may be fixedly coupled with base structure 165. Suspension structure 150 may allow image sensor 110 (and the substrate) to move relative to lenses 105 in one or more directions (e.g., approximately along X- and/or Y-axis) orthogonal to the optical axis of lenses 105 (or Z-axis) of camera 100, thus implementing an OIS function. Note that camera 100 is presented only as an example for purposes of illustration, and is not intended to limit use implementations of the present disclosure. For instance, in some embodiments, lenses 105 may be fixed and stationary, and only image sensor 110 may be movable in one or more directions, e.g., approximately along (1) Z-axis and/or (2) X- and/or Y-axis.

In the illustrated embodiment, substrate second block 130 includes an end stop 155*a* that may come into contact with end stop 155*b* of base 165. The end stop 155*a* coming into contact with end stop 155*b* of base 165 may prevent the substrate/image sensor assembly from moving outside a desired range of movement in the x direction (and/or the y direction, in embodiments). The space between the end stops 155*a/b* may allow for optical image stabilization (OIS) movement and/or for movement of the substrate/image sensor assembly as part of a process for shaking particles off of the IR filter to be captured by the dust trap sticky epoxy. One or more end stops may be formed otherwise on components of the interior of the camera to limit movement of the substrate/image sensor assembly in any combination of the x, y, or z directions, without departing from the scope of this disclosure.

Movement of lenses 105 and/or image sensor 110 may be controlled using one or more actuators. In some embodiments, the actuators may be implemented using voice coil motor (VCM) actuators. For instance, as indicated in FIG. 1, camera 100 may include one or more autofocus (AF) coils 145 contained in AF coil holders that are further affixed with lens holder 120. Thus, lenses 105 and AF coils 145 may be considered as one single rigid body to be able to move together. In addition, camera 100 may include one or more OIS coils 135 attached with substrate second block 130. Thus, OIS coils 135 and image sensor 110 may move together. Furthermore, camera 100 may include one or more magnets 140 held in magnets holders that are further fixedly coupled with housing 170 of camera 100. AF coils 145 may individually conduct respective current that may interact with magnetic fields of magnets 140 to generate motive force (e.g., Lorentz force) to move AF coils 145 and lenses 105 together relative to image sensor 110 approximately along Z-axis. Similarly, OIS coils 135 may individually interact electromagnetically with magnets 140 to cause movement of OIS coils 135 and image sensor 110 relative to lenses 105 approximately along X- and/or Y-axis.

As described above, the movability of image sensor 110 and the substrate (together with the OIS coils, sometimes referred to as the sensor-shift structure) may subject the sensor-shift structure to unwanted collisions with base structure 165. Thus, in some embodiments, camera 100 may include end stops 155*a/b* and or 157 *a/b* to stop motion of the substrate when it comes into contact with base structure 165. When image sensor 110 and the substrate move unexpectedly, or intentionally based on a signal from an actuator for example, towards base structure 165 approximately along X- and/or Y-axis, the sensor shift structure may touch base structure 165, directly colliding with base structure 165, e.g., the side walls of base structure 165. In some embodiments, the camera may be configured with less than all of end stops 155 *a/b* and 157 *a/b*.

FIG. 2 shows a zoomed cross-sectional view, according to some embodiments. End stop 157*a* of substrate third block 126 is illustrated next to end stop 157*b* of base 165. In some embodiments, ends stops may be formed from base structure 165, e.g., the side walls of base structure 165 facing the lateral sides of substrate second block 130, may include one or more portions protruding from base structure 165 and extending towards substrate second block 130. In some embodiments, the portions may be located at positions corresponding to the lateral sides of substrate second block 130. The end stop(s) may include coatings or other features to restrain movement of substrate second block 130 towards base structure 165 approximately along X- and/or Y-axis, thus protecting base structure 165 (and/or the substrate) from damage due to collisions therebetween.

Similar features may be oriented to limit movement in the Z direction, in embodiments, such as the underneath a side facing optically away from lenses 105 but proximate another portion (e.g., the bottom portion) of base structure 165. When the substrate moves unexpectedly towards the bottom portion of base structure 165 approximately along Z-axis, various structures of the substrate may directly collide with base structure 165 (in some embodiments, coatings or the like may reduce damage from the collision). Note that FIGS. 1 and 2 also show OIS coils 135 attached to substrate second block 130, and openings 132 and 134 of substrate first block 125 and substrate first block 125, respectively, that pass through light from infrared filter 115 to image sensor 110. FIGS. 1 and 2 illustrate a stiffener 111.

FIGS. 1 and 2 illustrate sticky dust trap 185, in between an outside edge of IR filter 115 and an edge of substrate second block 130. FIGS. 1 and 2 also illustrate sticky dust trap 180, on an upper surface of substrate second block 130, near-to OIS coil(s) 135. The dust trap 185 includes a sticky epoxy located in a gap 187 in between an outside edge of IR filter 115 and an edge of substrate second block 130, in embodiments. FIG. 2 illustrates a particle 190 that was lodged on IR filter 115 may move off of IR filter 115 and travel to various locations in the interior of the camera, such as to the sticky dust trap 185 or to the sticky dust trap 180, where the particle may be trapped by the sticky epoxy (e.g., so as to not travel onto IR filter 115 where the particle may cause blemishes in images taken by the camera sensor 110, for example.

FIG. 3A illustrates a top-down view of components of a camera, in accordance with some embodiments. FIG. 3A illustrates substrate second block 130 with OIS coils 135 and IR filter 115 surrounded by sticky dust trap 185. Also illustrated, dust trap 180A, 180B, 180C and 180D, located outside an area defined by the OIS coils (sometimes the coils or other features of the camera may be located between the dust traps 180a-d and the IR filter 115) provide additional surface area for catching particles 190. In the illustrated embodiments, sticky dust trap 185 and dust traps 180A-D are illustrated as continuous and dis-continuous or having independent sections (respectively). It is contemplated that individual ones of sticky dust trap 185 and dust traps 180A-D may also be configured as discontinuous and/or continuous, respectively, or various combinations thereof.

In addition, in some embodiments, base structure 165, e.g., the side walls of base structure 165 facing the lateral sides of substrate second block 130, may include one or more portions 167 protruding from base structure 165 and extending towards substrate second block 130. In some embodiments, portions 167 may be located at positions corresponding to end stops 155a/b (e.g., lateral sides of substrate second block 130).

Note that FIG. 2 also shows OIS coil 135 attached to substrate second block 130, and openings 132/134 of substrate first/second blocks 130/125 that pass through light from infrared filter 115 to image sensor 110.

Figure 3B:
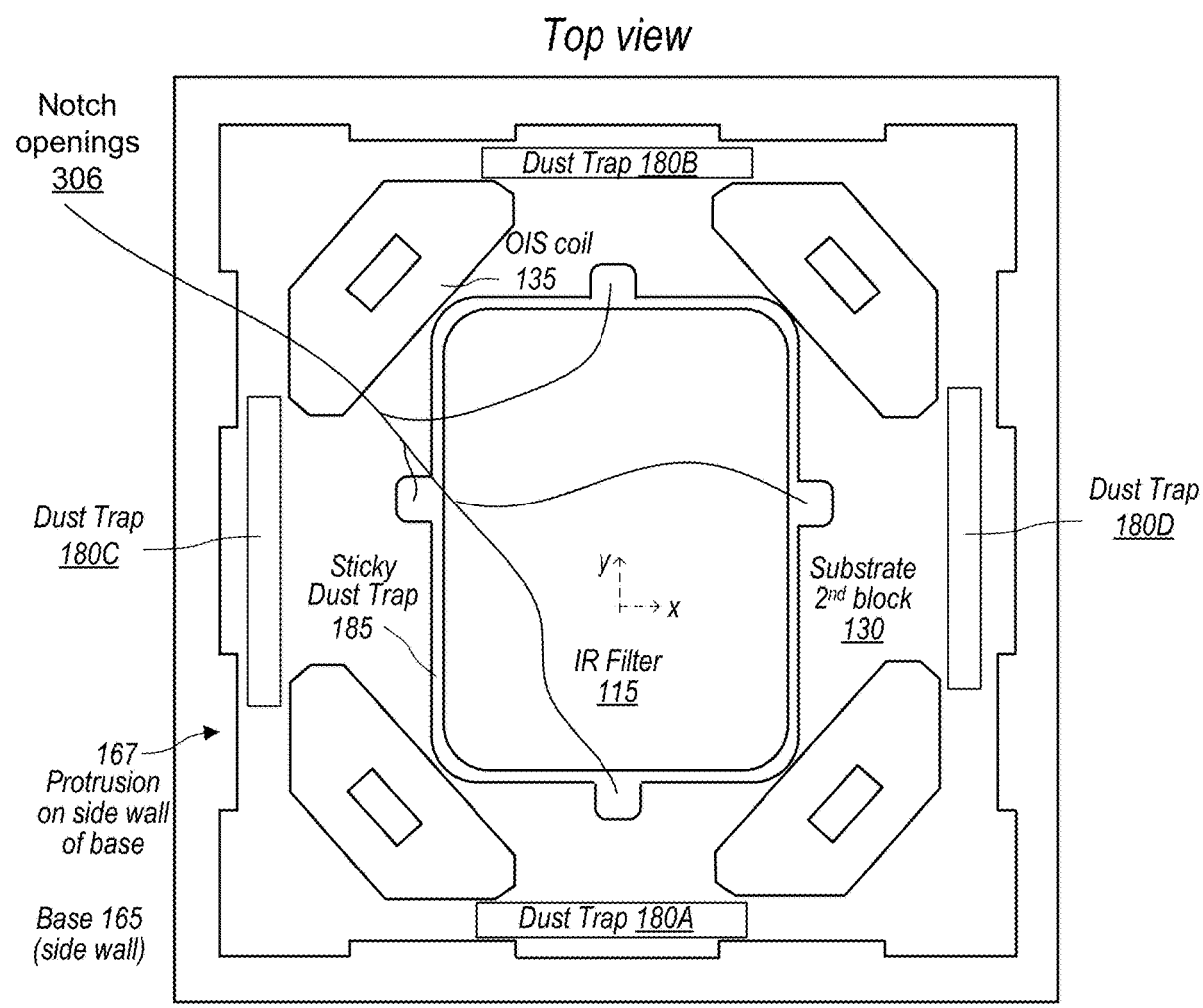
FIG. 3B illustrates a top-down view of components of a camera, in accordance with some embodiments.

FIG. 3B illustrates a top-down view of components of a camera, in accordance with some embodiments. In embodiments, the epoxy may be dispensed (directly) into a gap 187 (illustrated in FIG. 2) between substrate $2^{nd}$ block 130 and IR filter 115 such that the epoxy is placed between the substrate $2^{nd}$ block 130 and the IR filter 115. However, in some embodiments, the gap may be too narrow (or the dispensing needle too wide) for the epoxy dispensing machine to directly dispense the epoxy into the gap without causing overflow of the epoxy onto the IR filter 115. In some embodiments, the substrate $2^{nd}$ block 130 side of the gap 187 may be configured (e.g., via additive manufacturing or the like) such that the gap 187 is widened (e.g., to facilitate the dispensing of the epoxy without causing the overflow). In some embodiments, the IR filter overlap with the substrate $1^{st}$ block 125 may be reduced (e.g., a more narrow IR filter may be used to widen the dust trap gap 187 (FIG. 2) to facilitate application of the epoxy to the gap 187 without causing overflow). In some embodiments, both of the above-noted techniques may be applied to produce a wider gap 187 to avoid causing the overflow of the agent.

Also, FIG. 3B illustrates an embodiment with notch openings 306 in the substrate (e.g., substrate second block 130). In some embodiments, some such notch openings 306 may be produced and filled with epoxy. In embodiments, the notch openings 306 facilitate dispensing of the epoxy to form the sticky dust trap 185 while preventing the epoxy from overflowing onto the IR filter 115. It is contemplated that more or fewer notches may be used and/or that the notches may be of different shapes and/or sizes, without departing from the scope of this disclosure (e.g., based on the flow characteristics of the epoxy agent and/or the amount of the gap 187 in which stickiness is desired). Also, it is contemplated that the notches may be formed anywhere around the perimeter of the IR filter and may have features (e.g., width) that is wider than the gap 187 between the substrate $2^{nd}$ block 130 and IR filter 115. By utilizing notch openings 306 to dispense the epoxy, any widening of gap 187 may be avoided. Alternatively, it is contemplated that the techniques for producing a wider gap 187, above, may be combined with the embodiment comprising notches. In some embodiments, notch openings 306 may be formed and filled with an agent such as epoxy or resin instead of directly dispensing the agent along the gap 187. In some such embodiments, the agent applied to the notch openings may flow throughout some or all of the gap 187 and then cure to form the sticky dust trap 185.

FIG. 3B illustrates that, in embodiments, a component of a camera includes notches (e.g., formed in the substrate 130) to provide area for application of an agent to the one or more notches such that the agent flows into the gap (e.g., FIG. 2, 187) between the outside edge of the IR filter 115 and the substrate 130 without overflowing onto the IR filter. In embodiments, the sticky resin in the gap (e.g., the sticky dust trap 185) is formed of the cured agent once the agent has flowed from where it was applied (at the notch openings 306) to other areas of the gap to form the sticky dust trap 185.

Figure 4:
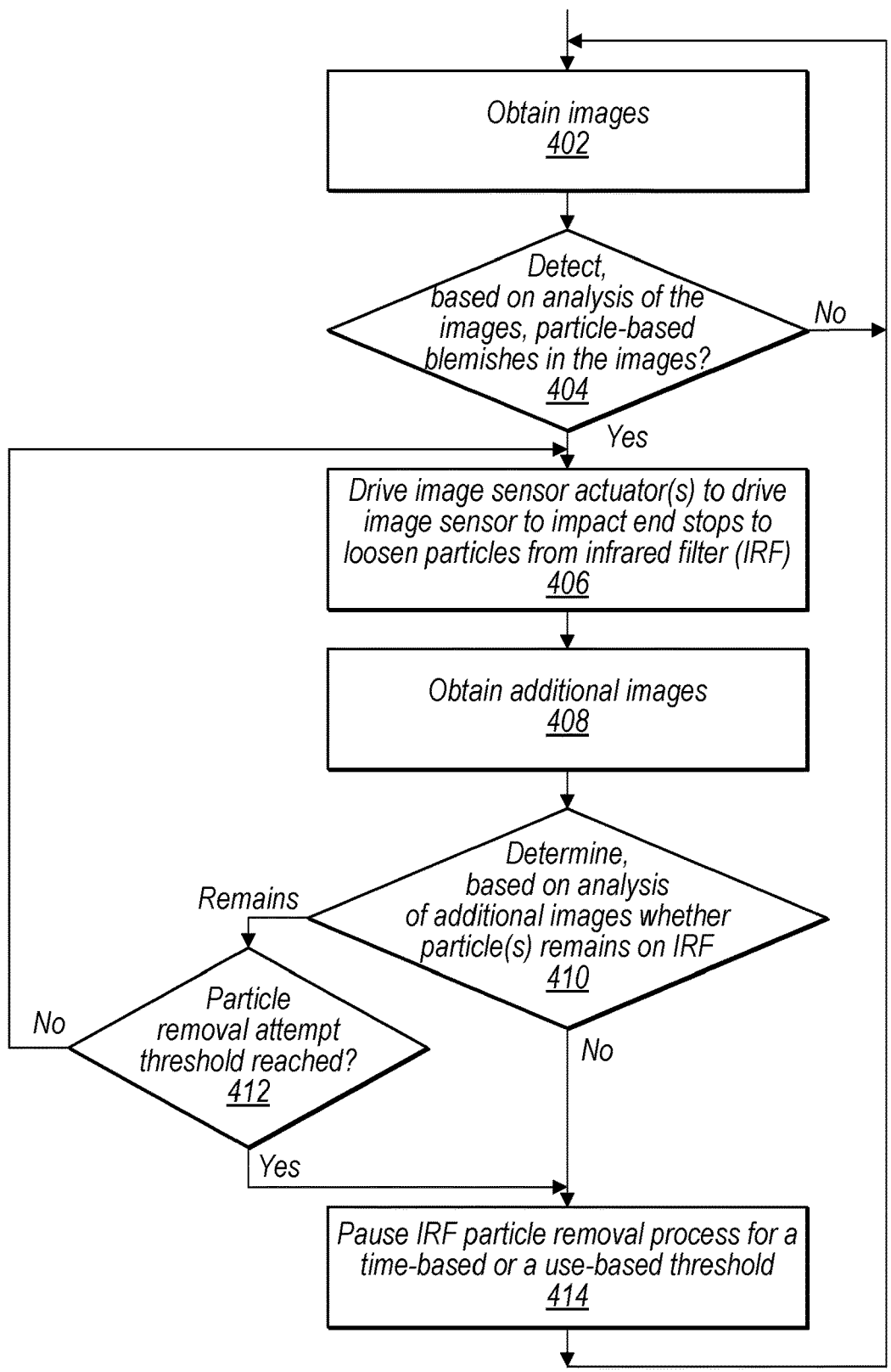
FIG. 4 illustrates a process diagram for an infrared filter particle loosening and particle capture process for use with various applications of sticky dust trap epoxy, in accordance with some embodiments.

FIG. 4 illustrates a process diagram for an infrared filter particle loosening and/or particle capture process for use with various applications of dust trap epoxy, in accordance with some embodiments.

Some or all of the steps of the process illustrated in FIG. 4 may be amenable to automation, may be performed during assembly of the camera or portable device comprising the camera, or may be performed by the assembled camera or device (e.g., by components illustrated in FIGS. 1-3A/B and 5-8. Some aspects of the illustrated process may be performed using equipment at manufacturing facility, or using the image sensor of the device in which the IR filter is installed.

In some embodiments, various combinations of the steps (e.g., in various different orders, in some embodiments) may be performed in response to a manual instruction. For example, a user selectable menu item of an interface of a camera or portable device encompassing the camera may trigger a process similar to the process illustrated in FIG. 4. The process is illustrated as possibly continuous. It is contemplated that the process may be performed once or a set number of times (such as at device initialization or assembly for example) instead of continuously.

At block 402, images are obtained. For example, an image sensor 110 may capture images of light passing through an IR filter 115. Block 404 illustrates detection, based on analysis of the images, of particle-based blemishes on the images. For example, detecting blemishes in the images may be performed by applying a machine learning model to the images to detect blemishes in the images caused by one or more particles on the IR filter. The machine learning model may be trained on images with types of blemishes associated with particles on the IR filter and then that model may be applied to detect such images from those obtained, in embodiments. Image analysis may include applying a machine-learning model over several images to determine if there are particle-based blemishes (e.g., to determine whether a same type of blemish and/or distortion shows up in the same place over several images). If particle-based images are not detected (block 404, no) the process may end or may return to block 402 where more images are obtained and so on.

If particle-based blemishes are detected (block 404, yes) the process may continue on to block 406, where image sensor actuators (e.g., OIS voice-coils or similar) are actuated to drive the substrate/image sensor assembly to impact end stops to loosen particles from the IR filter 115. For example, a controller (e.g., controller 504, or control program instructions, 811, both described below) may actuate a driver (e.g., driver 506, describe below) that drives OIS coils 135 of a camera module 510 particularly tailored for the camera 100.

In some embodiments, the image sensors actuators may be driven over a range of various frequencies suited to shaking loose various different types of particles. In some embodiments, the image sensor actuators may be driven to oscillate the IR filter without causing the substrate to impact end stops. The image sensor actuator(s) (e.g., OIS coils 135 and/or AF coils 145 may be driven to accelerate the IR filter 115 in any of various combinations of directions x, y, or even z. The image sensor actuator(s) may be driven to vibrate or otherwise shake loose particles on the IR filter 115, in embodiments.

In embodiments, the actuator frequency may be varied (e.g., for speed and/or stroke) to dislodge particles adhered to the IR filter surface. Once the particle is dislodged, sticky dust trap epoxy dispensed around the IR filter surface area can trap the particles.

Subsequent to driving the image sensor actuators, at block 408, additional images may be obtained (e.g., similar to block 402, or otherwise) and a determination made, based on analysis of the additional images, whether particles remain on the IR filter 115 (e.g., similar to block 404, in some embodiments). If no more images with blemishes associated with particles are detected (block 410, no) the IR filter particle removal process may be paused for a time-based (e.g., day, week, month, etc.) or for a use-based (e.g., until next device reboot, for a threshold number of images, etc.) threshold. If images with blemishes associated with particles are detected (block 410, remains) and a particle removal attempt threshold has not been reached (block 412, no) the process may return to block 406 and repeat (may repeat at a different frequency or oscillation, in some embodiments). If the threshold has been reached (block 412, yes) the IR filter particle removal process may be paused for a time-based (e.g., day, week, month, etc.) or for a use-based (e.g., until next device reboot, for a threshold number of images, etc.) threshold (block 414).

Figure 5:
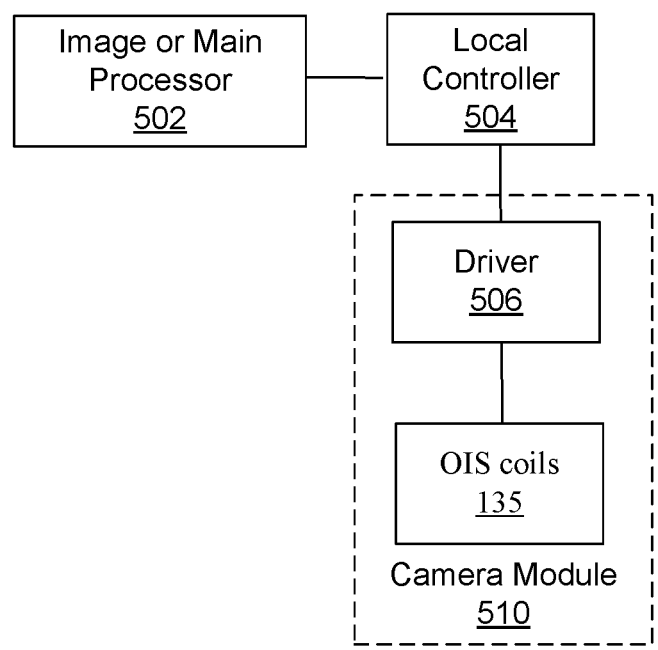
FIG. 5 illustrates a schematic diagram of components of a camera that implement a process for loosening particles from an infrared filter, according to some embodiments.

FIG. 5 illustrates a schematic of features for carrying out the process illustrated in FIG. 4 for the device 100 illustrated in FIGS. 1-3A/B and 6-8, according to some embodiments. As indicated in FIG. 5, an image processor (or a main processor) 502 may be coupled to a local controller 504 and the local controller connected to driver 506, which is in turn coupled to OIS coils 135 (together, part of a camera module). It is contemplated that the same or similar processor(s) 502 may be coupled to the same or similar local controllers and similar drivers that drive AF coils, in embodiments.

In some embodiments, the image or main processor 502 performs the obtaining (together with the image sensor), and detection in FIG. 4 and instructs the local controller 504 to cause driver 506 to drive OIS coils 135.

Figure 6:
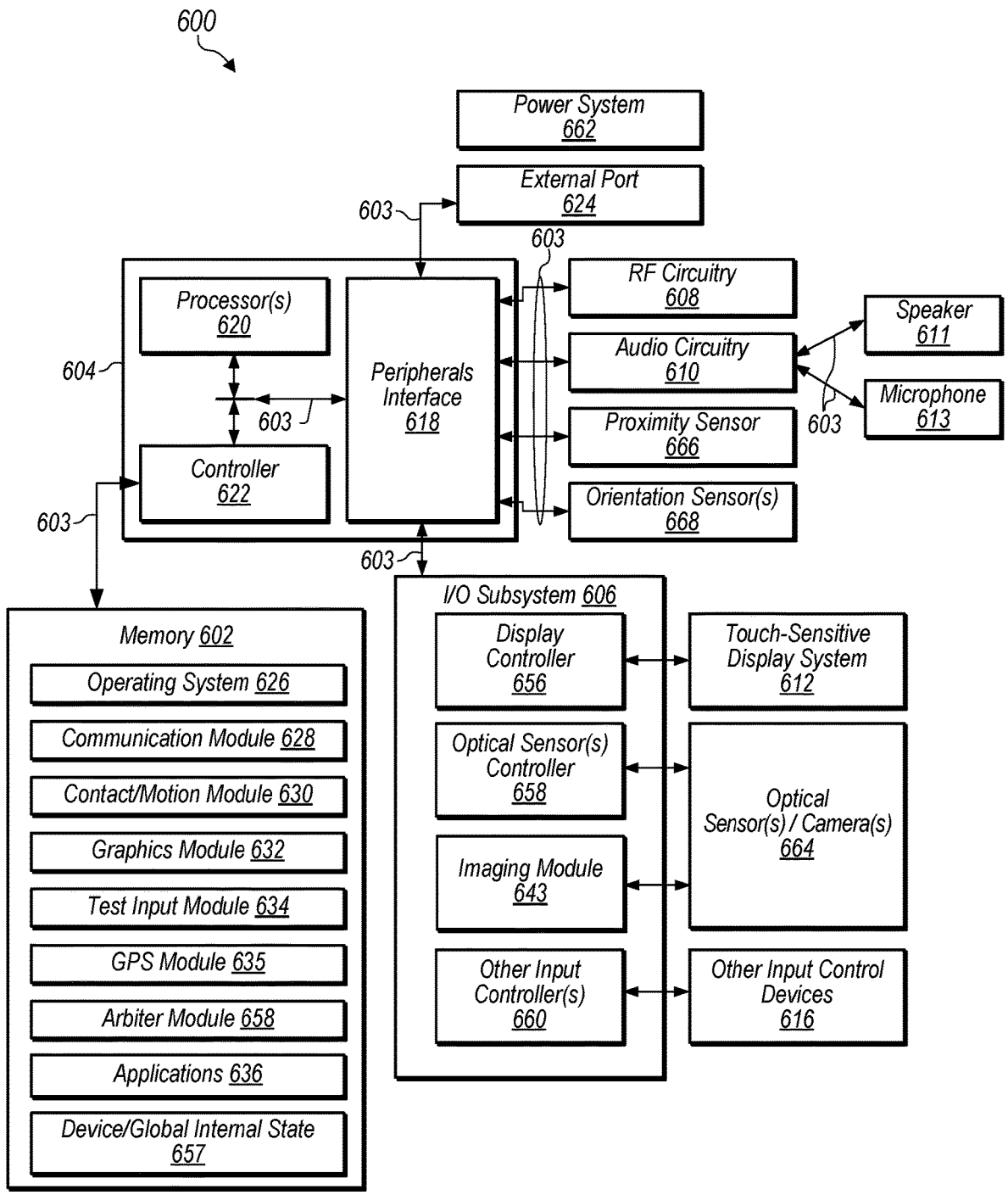
FIG. 6 illustrates a block diagram of an example portable multifunction device 600 that may include a camera that includes dust traps and sticky epoxy for particle capture, and that may perform a process for loosening particles from an infrared filter, in accordance with some embodiments.

FIG. 6 illustrates a block diagram of an example portable multifunction device 600 that may include a camera that includes dust traps and sticky epoxy for particle capture, and that may perform a process for loosening particles from an infrared filter, in accordance with some embodiments. In some embodiments, the portable multifunction device 600 may include one or multiple features, components, and/or functionality of embodiments described herein with reference to FIGS. 1-5, 7, and 8.

Camera(s) 664 (similar to camera 100, in some embodiments) is sometimes called an "optical sensor" for convenience, and may also be known as or called an optical sensor system. Device 600 may include memory 602 (which may include one or more computer readable storage mediums), memory controller 622, one or more processing units (CPUs) 620, peripherals interface 618, RF circuitry 608, audio circuitry 610, speaker 611, touch-sensitive display system 612, microphone 613, input/output (I/O) subsystem 606, other input or control devices 616, and external port 624. Device 600 may include one or more optical sensors 664 (similar to image sensor 110, in some embodiments). These components may communicate over one or more communication buses or signal lines 603.

It should be appreciated that device 600 is only one example of a portable multifunction device, and that device 600 may have more or fewer components than shown, may combine two or more components, or may have a different configuration or arrangement of the components. The various components shown in FIG. 6 may be implemented in hardware, software, or a combination of hardware and software, including one or more signal processing and/or application specific integrated circuits.

Memory 602 may include high-speed random-access memory and may also include non-volatile memory, such as one or more magnetic disk storage devices, flash memory devices, or other non-volatile solid-state memory devices. Access to memory 602 by other components of device 600, such as CPU 620 and the peripherals interface 618, may be controlled by memory controller 622.

Peripherals interface 618 can be used to couple input and output peripherals of the device to CPU 620 and memory 602. The one or more processors 620 run or execute various software programs and/or sets of instructions stored in memory 602 to perform various functions for device 600 and to process data.

In some embodiments, peripherals interface 618, CPU 620, and memory controller 622 may be implemented on a single chip, such as chip 604. In some other embodiments, they may be implemented on separate chips.

RF (radio frequency) circuitry 608 receives and sends RF signals, also called electromagnetic signals. RF circuitry 608 converts electrical signals to/from electromagnetic signals and communicates with communications networks and other communications devices via the electromagnetic signals. RF circuitry 608 may include well-known circuitry for performing these functions, including but not limited to an antenna system, an RF transceiver, one or more amplifiers, a tuner, one or more oscillators, a digital signal processor, a CODEC chipset, a subscriber identity module (SIM) card, memory, and so forth. RF circuitry 608 may communicate with networks, such as the Internet, also referred to as the World Wide Web (WWW), an intranet and/or a wireless network, such as a cellular telephone network, a wireless local area network (LAN) and/or a metropolitan area network (MAN), and other devices by wireless communication. The wireless communication may use any of a variety of communications standards, protocols and technologies, including but not limited to Global System for Mobile Communications (GSM), Enhanced Data GSM Environment (EDGE), high-speed downlink packet access (HSDPA), high-speed uplink packet access (HSUPA), wideband code division multiple access (W-CDMA), code division multiple access (CDMA), time division multiple access (TDMA), Bluetooth, Wireless Fidelity (Wi-Fi) (e.g., IEEE 802.11a, IEEE 802.11b, IEEE 802.11g and/or IEEE 802.11n), voice over Internet Protocol (VOIP), Wi-MAX, a protocol for e-mail (e.g., Internet message access protocol (IMAP) and/or post office protocol (POP)), instant messaging (e.g., extensible messaging and presence protocol (XMPP), Session Initiation Protocol for Instant Messaging and Presence Leveraging Extensions (SIMPLE), Instant Messaging and Presence Service (IMPS)), and/or Short Message Service (SMS), or any other suitable communication protocol, including communication protocols not yet developed as of the filing date of this document.

Audio circuitry 610, speaker 611, and microphone 613 provide an audio interface between a user and device 600. Audio circuitry 610 receives audio data from peripherals interface 618, converts the audio data to an electrical signal, and transmits the electrical signal to speaker 611. Speaker 611 converts the electrical signal to human-audible sound waves. Audio circuitry 610 also receives electrical signals converted by microphone 613 from sound waves. Audio circuitry 610 converts the electrical signal to audio data and transmits the audio data to peripherals interface 618 for processing. Audio data may be retrieved from and/or transmitted to memory 602 and/or RF circuitry 608 by peripherals interface 618. In some embodiments, audio circuitry 610 also includes a headset jack (e.g., 712, FIG. 7). The headset jack provides an interface between audio circuitry 610 and removable audio input/output peripherals, such as output-only headphones or a headset with both output (e.g., a headphone for one or both ears) and input (e.g., a microphone).

I/O subsystem 606 couples input/output peripherals on device 600, such as touch screen 612 and other input control devices 616, to peripherals interface 618. I/O subsystem 606 may include display controller 656 and one or more input controllers 660 for other input or control devices. The one or more input controllers 660 receive/send electrical signals from/to other input or control devices 616. The other input control devices 616 may include physical buttons (e.g., push buttons, rocker buttons, etc.), dials, slider switches, joysticks, click wheels, and so forth. In some alternate embodiments, input controller(s) 660 may be coupled to any (or none) of the following: a keyboard, infrared port, USB port, and a pointer device such as a mouse. The one or more buttons (e.g., 708, FIG. 7) may include an up/down button for volume control of speaker 611 and/or microphone 613. The one or more buttons may include a push button (e.g., 706, FIG. 7).

Touch-sensitive display 612 provides an input interface and an output interface between the device and a user. Display controller 656 receives and/or sends electrical signals from/to touch screen 612. Touch screen 612 displays visual output to the user. The visual output may include graphics, text, icons, video, and any combination thereof (collectively termed "graphics"). In some embodiments, some or all of the visual output may correspond to user-interface objects.

Touch screen 612 has a touch-sensitive surface, sensor or set of sensors that accepts input from the user based on haptic and/or tactile contact. Touch screen 612 and display controller 656 (along with any associated modules and/or sets of instructions in memory 602) detect contact (and any movement or breaking of the contact) on touch screen 612 and converts the detected contact into interaction with user-interface objects (e.g., one or more soft keys, icons, web pages or images) that are displayed on touch screen 612. In an example embodiment, a point of contact between touch screen 612 and the user corresponds to a finger of the user.

Touch screen 612 may use LCD (liquid crystal display) technology, LPD (light emitting polymer display) technology, or LED (light emitting diode) technology, although other display technologies may be used in other embodiments. Touch screen 612 and display controller 656 may detect contact and any movement or breaking thereof using any of a variety of touch sensing technologies now known or later developed, including but not limited to capacitive, resistive, infrared, and surface acoustic wave technologies, as well as other proximity sensor arrays or other elements for determining one or more points of contact with touch screen 612. In an example embodiment, projected mutual capacitance sensing technology is used.

Touch screen 612 may have a video resolution in excess of 100 dpi. In some embodiments, the touch screen has a video resolution of approximately 160 dpi. The user may make contact with touch screen 612 using any suitable object or appendage, such as a stylus, a finger, and so forth. In some embodiments, the user interface is designed to work primarily with finger-based contacts and gestures, which can be less precise than stylus-based input due to the larger area of contact of a finger on the touch screen. In some embodiments, the device translates the rough finger-based input into a precise pointer/cursor position or command for performing the actions desired by the user.

In some embodiments, in addition to the touch screen, device 600 may include a touchpad (not shown) for activating or deactivating particular functions. In some embodiments, the touchpad is a touch-sensitive area of the device that, unlike the touch screen, does not display visual output. The touchpad may be a touch-sensitive surface that is separate from touch screen 612 or an extension of the touch-sensitive surface formed by the touch screen.

Device 600 also includes power system 662 for powering the various components. Power system 662 may include a power management system, one or more power sources (e.g., battery, alternating current (AC)), a recharging system, a power failure detection circuit, a power converter or inverter, a power status indicator (e.g., a light-emitting diode (LED)) and any other components associated with the generation, management and distribution of power in portable devices.

Device 600 may also include one or more optical sensors or cameras 664 (similar to image sensor 110, in some embodiments). FIG. 6 shows an optical sensor 664 coupled to optical sensor controller 658 in I/O subsystem 606. Optical sensor 664 may include charge-coupled device (CCD) or complementary metal-oxide semiconductor (CMOS) phototransistors. Optical sensor 664 receives light from the environment, projected through one or more lens (e.g., lenses 105), and converts the light to data representing an image. In conjunction with imaging module 643 (also called a camera module), optical sensor 664 may capture still images or video. In some embodiments, an optical sensor 664 is located on the back of device 600, opposite touch screen display 612 on the front of the device, so that the touch screen display 612 may be used as a viewfinder for still and/or video image acquisition. In some embodiments, another optical sensor is located on the front of the device so that the user's image may be obtained for videoconferencing while the user views the other video conference participants on the touch screen display.

Device 600 may also include one or more proximity sensors 666. FIG. 6 shows proximity sensor 666 coupled to peripherals interface 618. Alternately, proximity sensor 666 may be coupled to input controller 660 in I/O subsystem 606. In some embodiments, the proximity sensor 666 turns off and disables touch screen 612 when the multifunction device 600 is placed near the user's ear (e.g., when the user is making a phone call).

Device 600 includes one or more orientation sensors 668. In some embodiments, the one or more orientation sensors 668 include one or more accelerometers (e.g., one or more linear accelerometers and/or one or more rotational accelerometers). In some embodiments, the one or more orientation sensors 668 include one or more gyroscopes. In some embodiments, the one or more orientation sensors 668 include one or more magnetometers. In some embodiments, the one or more orientation sensors 668 include one or more of global positioning system (GPS), Global Navigation Satellite System (GLONASS), and/or other global navigation system receivers. The GPS, GLONASS, and/or other global navigation system receivers may be used for obtaining information concerning the location and orientation (e.g., portrait or landscape) of device 600. In some embodiments, the one or more orientation sensors 668 include any combination of orientation/rotation sensors. FIG. 6 shows the one or more orientation sensors 668 coupled to peripherals interface 618. Alternately, the one or more orientation sensors 668 may be coupled to an input controller 660 in I/O subsystem 606. In some embodiments, information is displayed on the touch screen display 612 in a portrait view or a landscape view based on an analysis of data received from the one or more orientation sensors 668.

In some embodiments, the software components stored in memory 602 include operating system 626, communication module (or set of instructions) 628, contact/motion module (or set of instructions) 630, graphics module (or set of instructions) 632, text input module (or set of instructions) 634, Global Positioning System (GPS) module (or set of instructions) 635, arbiter module 658 and applications (or sets of instructions) 636. Furthermore, in some embodiments memory 602 stores device/global internal state 657. Device/global internal state 657 includes one or more of: active application state, indicating which applications, if any, are currently active; display state, indicating what applications, views or other information occupy various regions of touch screen display 612; sensor state, including information obtained from the device's various sensors and input control devices 616; and location information concerning the device's location and/or attitude.

Operating system 626 (e.g., Darwin, RTXC, LINUX, UNIX, OS X, WINDOWS, or an embedded operating system such as VxWorks) includes various software components and/or drivers for controlling and managing general system tasks (e.g., memory management, storage device control, power management, etc.) and facilitates communication between various hardware and software components.

Communication module 628 facilitates communication with other devices over one or more external ports 624 and also includes various software components for handling data received by RF circuitry 608 and/or external port 624. External port 624 (e.g., Universal Serial Bus (USB), FIREWIRE, etc.) is adapted for coupling directly to other devices or indirectly over a network (e.g., the Internet, wireless LAN, etc.). In some embodiments, the external port is a multi-pin (e.g., 30-pin) connector.

Contact/motion module 630 may detect contact with touch screen 612 (in conjunction with display controller 656) and other touch sensitive devices (e.g., a touchpad or physical click wheel). In some embodiments, contact/motion module 630 and display controller 656 detect contact on a touchpad. Contact/motion module 630 may detect a gesture input by a user. Different gestures on the touch-sensitive surface have different contact patterns. Graphics module 632 includes various known software components for rendering and displaying graphics on touch screen 612 or other display, including components for changing the intensity of graphics that are displayed. As used herein, the term "graphics" includes any object that can be displayed to a user, including without limitation text, web pages, icons (such as user-interface objects including soft keys), digital images, videos, animations and the like. Text input module 634, which may be a component of graphics module 632, provides soft keyboards for entering text in various applications (e.g., contacts, e-mail, and any other application that needs text input). GPS module 635 determines the location of the device and provides this information for use in various applications 636 (e.g., to a camera application as picture/video metadata).

Applications 636 may include one or more modules (e.g., a contacts module, an email client module, a camera module for still and/or video images, etc.) Examples of other applications 636 that may be stored in memory 602 include other word processing applications, other image editing applications, drawing applications, presentation applications, JAVA-enabled applications, encryption, digital rights management, voice recognition, and voice replication. Each of the modules and applications correspond to a set of executable instructions for performing one or more functions described above and the methods described in this application (e.g., the computer-implemented methods and other information processing methods described herein). These modules (i.e., sets of instructions) need not be implemented as separate software programs, procedures or modules, and thus various subsets of these modules may be combined or otherwise re-arranged in various embodiments. In some embodiments, memory 602 may store a subset of the modules and data structures identified above. Furthermore, memory 602 may store additional modules and data structures not described above.

Figure 7:
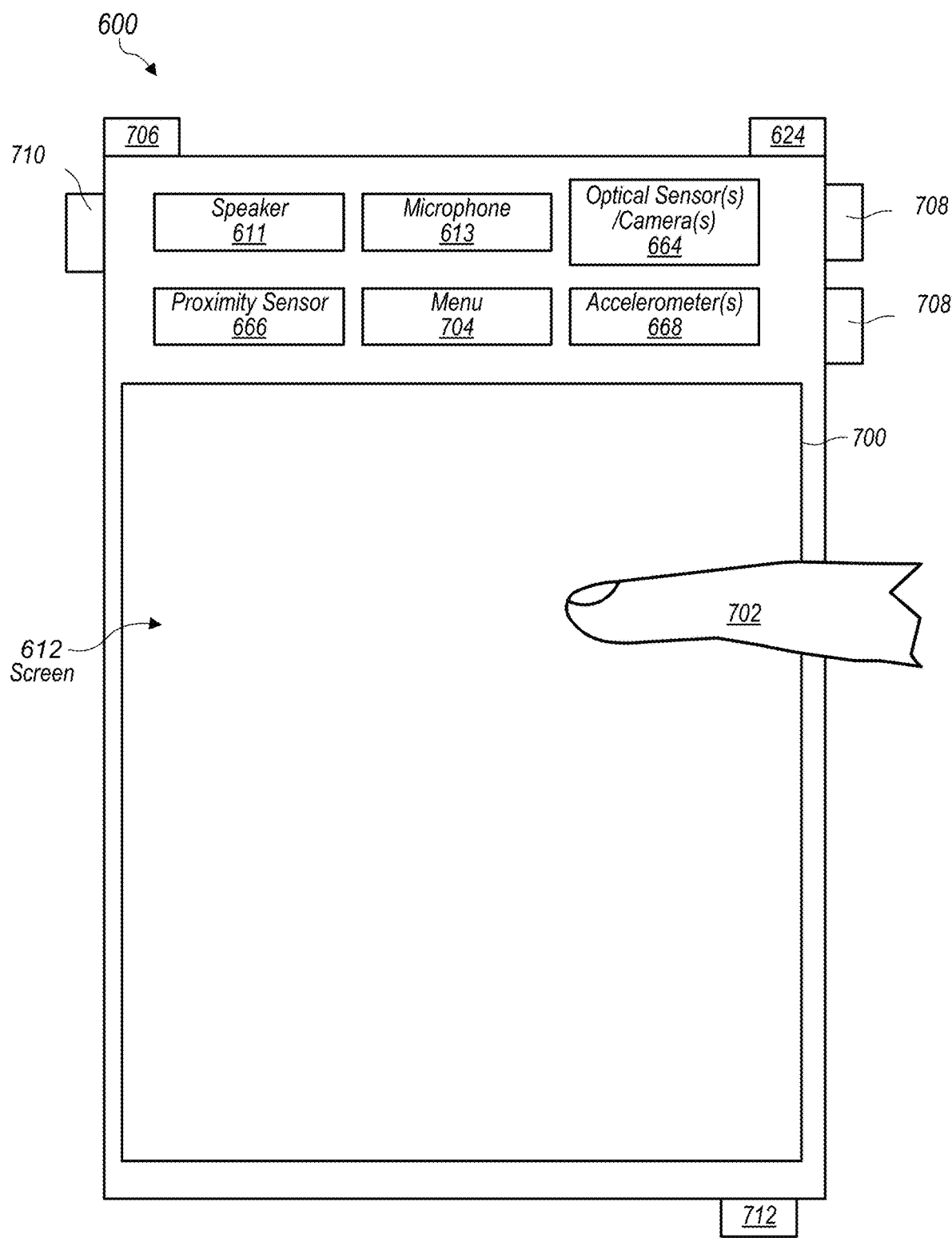
FIG. 7 illustrates a schematic representation of a portable device that may include a camera module that includes dust traps and sticky epoxy for particle capture, and that may perform a process for loosening particles from an infrared filter, in accordance with some embodiments.

FIG. 7 illustrates a schematic representation of a portable device that may include a camera module that includes dust traps and sticky epoxy for particle capture, and that may perform a process for loosening particles from an infrared filter, in accordance with some embodiments. In some embodiments, the portable multifunction device 600 may include one or multiple features, components, and/or functionality of embodiments described herein with reference to FIGS. 1-6 and 8.

The device 600 may have a touch screen 612. The touch screen 612 may display one or more graphics within user interface (UI) 700. In this embodiment, as well as others described below, a user may select one or more of the graphics by making a gesture on the graphics, for example, with one or more fingers 702 (not drawn to scale in the figure) or one or more styluses.

Device 600 may also include one or more physical buttons, such as "home" or menu button 704. As described previously, menu button 704 may be used to navigate to any application 636 in a set of applications that may be executed on device 600. Alternatively, in some embodiments, the menu button 704 is implemented as a soft key in a GUI displayed on touch screen 612.

In one embodiment, device 600 includes touch screen 612, menu button 704, push button 706 for powering the device on/off and locking the device, volume adjustment button(s) 708, Subscriber Identity Module (SIM) card slot 710, head set jack 712, and docking/charging external port 624. Push button 706 may be used to turn the power on/off on the device by depressing the button and holding the button in the depressed state for a predefined time interval; to lock the device by depressing the button and releasing the button before the predefined time interval has elapsed; and/or to unlock the device or initiate an unlock process. In an alternative embodiment, device 600 also may accept verbal input for activation or deactivation of some functions through microphone 613.

It should be noted that, although many of the examples herein are given with reference to optical sensor(s)/camera(s) 664 (on the front of a device), one or more rear-facing cameras or optical sensors that are pointed opposite from the display may be used instead of, or in addition to, an optical sensor(s)/camera(s) 664 on the front of a device.

Figure 8:
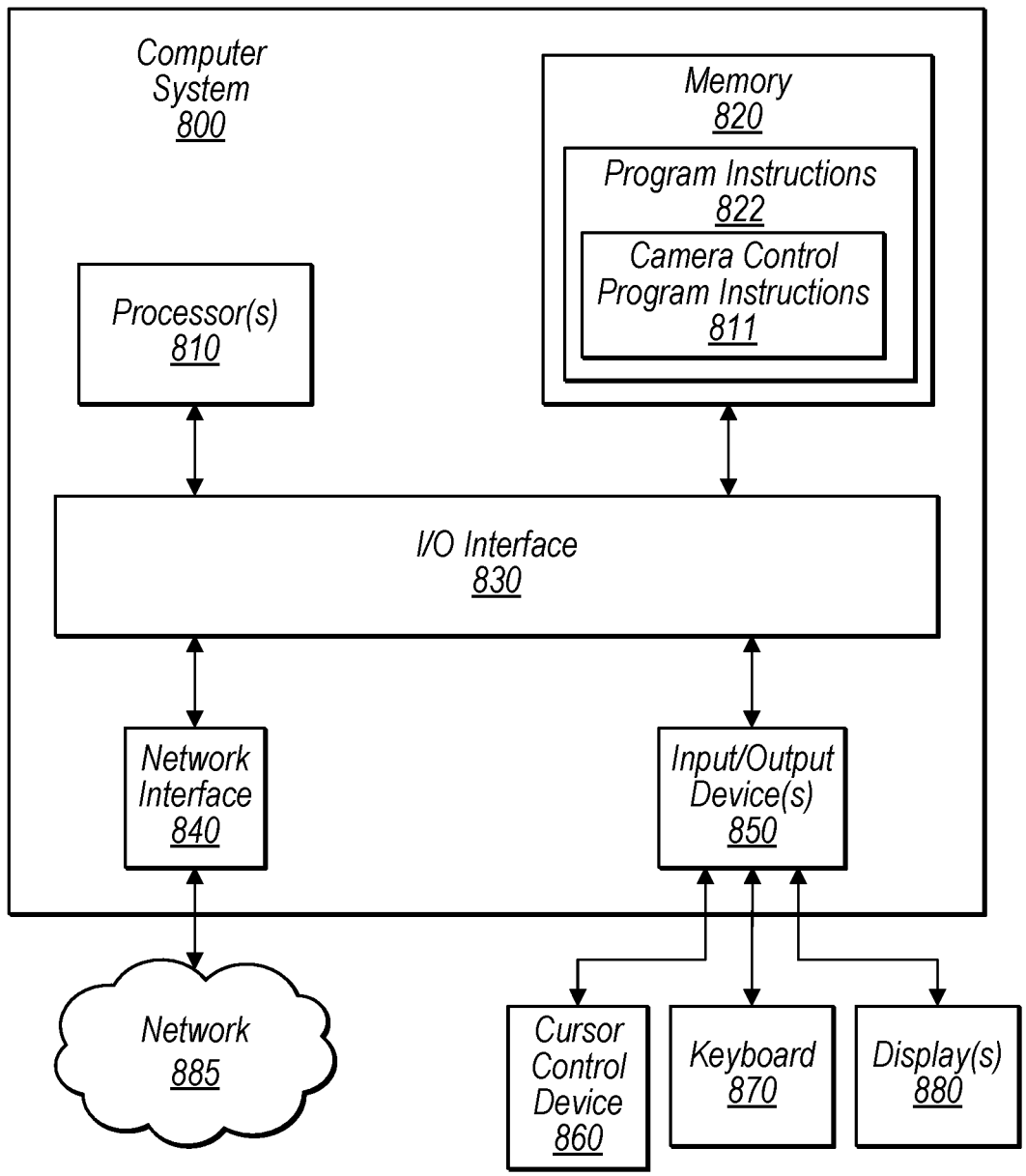
FIG. 8 illustrates a schematic block diagram of an example computer system that may include a camera module with that includes dust traps and sticky epoxy for particle capture, and that may perform a process for loosening particles from an infrared filter, in accordance with some embodiments.

FIG. 8 illustrates a schematic block diagram of an example computer system that may include a camera module with that includes dust traps and sticky epoxy for particle capture, and that may perform a process for loosening particles from an infrared filter, in accordance with some embodiments. In some embodiments, the computer system 800 may include one or multiple features, components, and/or functionality of embodiments described herein with reference to FIGS. 1-7.

The computer system 800 may be configured to execute any or all of the embodiments described above. In different embodiments, computer system 800 may be any of various types of devices, including, but not limited to, a personal computer system, desktop computer, laptop, notebook, tablet, slate, pad, or netbook computer, mainframe computer system, handheld computer, workstation, network computer, a camera, a set top box, a mobile device, a consumer device, video game console, handheld video game device, application server, storage device, a television, a video recording device, a peripheral device such as a switch, modem, router, or in general any type of computing or electronic device.

Various embodiments of a camera motion control system as described herein, including embodiments of magnetic position sensing, as described herein may be executed in one or more computer systems 800, which may interact with various other devices. Note that any component, action, or functionality described above with respect to FIGS. 1-7 may be implemented on one or more computers configured as computer system 800 of FIG. 8, according to various embodiments. In the illustrated embodiment, computer system 800 includes one or more processors 810 coupled to a system memory 820 via an input/output (I/O) interface 830. Computer system 800 further includes a network interface 840 coupled to I/O interface 830, and one or more input/output devices 850, such as cursor control device 860, keyboard 870, and display(s) 880. In some cases, it is contemplated that embodiments may be implemented using a single instance of computer system 800, while in other embodiments multiple such systems, or multiple nodes making up computer system 800, may be configured to host different portions or instances of embodiments. For example, in one embodiment some elements may be implemented via one or more nodes of computer system 800 that are distinct from those nodes implementing other elements.

In various embodiments, computer system 800 may be a uniprocessor system including one processor 810, or a multiprocessor system including several processors 810 (e.g., two, four, eight, or another suitable number). Processors 810 may be any suitable processor capable of executing instructions. For example, in various embodiments processors 810 may be general-purpose or embedded processors implementing any of a variety of instruction set architectures (ISAs), such as the x86, PowerPC, SPARC, or MIPS ISAs, or any other suitable ISA. In multiprocessor systems, each of processors 810 may commonly, but not necessarily, implement the same ISA.

System memory 820 may be configured to store program instructions 820, camera control program instructions 822 and/or camera control data accessible by processor 810. In various embodiments, system memory 820 may be implemented using any suitable memory technology, such as static random-access memory (SRAM), synchronous dynamic RAM (SDRAM), nonvolatile/Flash-type memory, or any other type of memory. In the illustrated embodiment, program instructions 822 may be configured to implement an infrared filter shake application 824 incorporating any of the functionality described above. Additionally, existing camera control data and/or instructions 811 of memory 820 may include any of the information or data structures described above. In some embodiments, program instructions and/or data may be received, sent or stored upon different types of computer-accessible media or on similar media separate from system memory 820 or computer system 800. While computer system 800 is described as implementing the functionality of functional blocks of previous Figures, any of the functionality described herein may be implemented via such a computer system.

In one embodiment, I/O interface 830 may be configured to coordinate I/O traffic between processor 810, system memory 820, and any peripheral devices in the device, including network interface 840 or other peripheral interfaces, such as input/output devices 850. In some embodiments, I/O interface 830 may perform any necessary protocol, timing or other data transformations to convert data signals from one component (e.g., system memory 820) into a format suitable for use by another component (e.g., processor 810). In some embodiments, I/O interface 830 may include support for devices attached through various types of peripheral buses, such as a variant of the Peripheral Component Interconnect (PCI) bus standard or the Universal Serial Bus (USB) standard, for example. In some embodiments, the function of I/O interface 830 may be split into two or more separate components, such as a north bridge and a south bridge, for example. Also, in some embodiments some or all of the functionality of I/O interface 830, such as an interface to system memory 820, may be incorporated directly into processor 810.

Network interface 840 may be configured to allow data to be exchanged between computer system 800 and other devices attached to a network 885 (e.g., carrier or agent devices) or between nodes of computer system 800. Network 885 may in various embodiments include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 840 may support communication via wired or wireless general data networks, such as any suitable type of Ethernet network, for example; via telecommunications/telephony networks such as analog voice networks or digital fiber communications networks; via storage area networks such as Fiber Channel SANs, or via any other suitable type of network and/or protocol.

Input/output devices 850 may, in some embodiments, include one or more display terminals, keyboards, keypads, touchpads, scanning devices, voice or optical recognition devices, or any other devices suitable for entering or accessing data by one or more computer systems 800. Multiple input/output devices 850 may be present in computer system 800 or may be distributed on various nodes of computer system 800. In some embodiments, similar input/output devices may be separate from computer system 800 and may interact with one or more nodes of computer system 800 through a wired or wireless connection, such as over network interface 840.

As shown in FIG. 8, memory 820 may include program instructions 822, which may be processor-executable to implement any element or action described above. In one embodiment, the program instructions may implement the methods described above. In other embodiments, different elements and data may be included. Note that data may include any data or information described above.

Those skilled in the art will appreciate that computer system 800 is merely illustrative and is not intended to limit the scope of embodiments. In particular, the computer system and devices may include any combination of hardware or software that can perform the indicated functions, including computers, network devices, Internet appliances, PDAs, wireless phones, pagers, etc. Computer system 800 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-accessible medium separate from computer system 800 may be transmitted to computer system 800 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer-accessible medium. Generally speaking, a computer-accessible medium may include a non-transitory, computer-readable storage medium or memory medium such as magnetic or optical media, e.g., disk or DVD/CD-ROM, volatile or non-volatile media such as RAM (e.g., SDRAM, DDR, RDRAM, SRAM, etc.), ROM, etc. In some embodiments, a computer-accessible medium may include transmission media or signals such as electrical, electromagnetic, or digital signals, conveyed via a communication medium such as network and/or a wireless link.

The methods described herein may be implemented in software, hardware, or a combination thereof, in different embodiments. In addition, the order of the blocks of the methods may be changed, and various elements may be added, reordered, combined, omitted, modified, etc. Various modifications and changes may be made as would be obvious to a person skilled in the art having the benefit of this disclosure. The various embodiments described herein are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

What is claimed is:

1. A camera, comprising:
   one or more lenses;
   an image sensor configured to receive light from the one or more lenses along an optical axis;
   a substrate attached to the image sensor and an infrared filter (IR filter) located over the image sensor such that the image sensor, IR filter, and the substrate move together relative to the one or more lenses in one or more directions;
   an actuator configured to implement movement of the image sensor, IR filter, and the substrate relative to the one or more lenses in the one or more directions;
   a gap formed between an outside edge of the IR filter and an edge of the substrate; and
   a sticky resin, located in the gap between an outside edge of the IR filter and the substrate, wherein the sticky resin is configured to capture particles dislodged from a surface of the IR filter.

2. The camera of claim 1, further comprising:
   one or more base structures coupled to a housing of the camera; and
   one or more end stops of the substrate, the end stops arranged in proximity to the respective one or more base structure so as to limit the movement of the image sensor, IR filter, and the substrate with respect to the base structures.

3. The camera of claim 2, further comprising:
   a controller configured to instruct the actuator to drive a voice coil so as to cause the one or more end stops to strike the one or more base structures to shake loose the particles from a surface of the IR filter.

4. The camera of claim 1, further comprising:
   additional sticky resin configured to capture particles, the additional sticky resin located on a surface, facing away from the image sensor.

5. The camera of claim 4, wherein the additional sticky resin configured to capture particles is located on a surface of the substrate between the gap and an outside edge of the substrate.

6. The camera of claim 1, wherein the sticky resin, located in the gap between the outside edge of the IR filter and the substrate, forms a continuous ring around the IR filter.

7. The camera of claim 1, wherein the sticky resin is a type of resin, different from an assembly epoxy used in assembly of the other components of the camera, comprising characteristics of:
   lower bleed than the assembly epoxy;
   lower viscosity than the assembly epoxy;
   lower curing temperature than the assembly epoxy; and
   more sticky for loose particles in the assembled camera than the assembly epoxy.

8. A method, comprising:
   obtaining, via an image sensor of a camera comprising an infrared (IR) filter coupled to a substrate in moveable arrangement with one or more end stops of a base of the camera, one or more images;
   detecting, based on analysis of the images, one or more particle-based blemishes in the one or more images;
   driving an image sensor actuator of the camera to cause the substrate to impact one or more of the end stops to loosen one or more particles causing the blemishes.

9. The method of claim 8, further comprising:
   obtaining one or more additional images of the IR filter;
   determining, based on analysis of the additional images, that the blemishes are removed; and
   terminating, based on the determination, the IR filter particle removal process.

10. The method of claim 8, further comprising:
    obtaining one or more additional images of the IR filter;
    determining, based on analyzing the additional images, that at least some of the blemishes remain;
    driving, based on the determining that at least some of the blemishes remain, the image sensor actuator of the camera to cause the substrate to impact one or more of the end stops to loosen one or more remaining particles causing the remaining blemishes.

11. The method of claim 8, where said detecting one or more blemishes in the one or more images comprises applying a machine learning model to the one or more images to detect blemishes in the one or more images caused by one or more particles on the IR filter.

12. The method of claim 8, wherein said driving the image sensor actuator of the camera to cause the substrate to impact the one or more of the end stops to loosen one or more particles causing the blemishes comprises driving the image sensor actuator to oscillate across a range or frequencies.

13. The method of claim 8, further comprising:
    subsequent to said driving the image sensor actuator of the camera to cause the substrate to impact one or more of the end stops to loosen one or more particles causing the blemishes,
       determining, based on analyzing additional images, that at least some of the blemishes remain; and
       driving the image sensor actuator of the camera at a different frequency from the prior driving.

14. A device, comprising:
    a camera, comprising:
       one or more lenses;
       an image sensor configured to receive light from the one or more lenses along an optical axis;
       a substrate attached to the image sensor and an infrared filter (IR filter) located over the image sensor such that the image sensor, IR filter, and the substrate move together relative to the one or more lenses in one or more directions;
       an actuator configured to implement movement of the image sensor, IR filter, and the substrate relative to the one or more lenses in the one or more directions;
       a gap formed between an outside edge of the IR filter and an edge of the substrate; and
       a sticky resin, located in the gap between an outside edge of the IR filter and the substrate, wherein the sticky resin is configured to capture particles dislodged from a surface of the IR filter; and
    a controller configured to operate the actuator to shake loose the particles from a surface of the IR filter.

15. The device of claim 14, further comprising:
    one or more base structures coupled to a housing of the camera; and
    one or more end stops of the substrate, the end stops arranged in proximity to the respective one or more base structure so as to limit the movement of the image sensor, IR filter, and the substrate with respect to the base structures.

16. The device of claim 15, further comprising:
    a controller configured to instruct the actuator to drive a voice coil so as to cause the one or more end stops to strike the one or more base structures to shake loose the particles from a surface of the IR filter.

17. The device of claim 14, further comprising:
    additional sticky resin configured to capture particles, the additional sticky resin located on a surface facing away from the image sensor.

18. The device of claim 17, wherein the additional sticky resin configured to capture particles is located on a surface of the substrate between the gap and an outside edge of the substrate.

19. The device of claim 14, further comprising one or more notches formed in the substrate to provide area for application of an agent to the one or more notches such that the agent flows into the gap between the outside edge of the IR filter and the substrate without overflowing onto the IR filter, the sticky resin in the gap formed of the agent when cured.

20. The device of claim 14, wherein the sticky resin is a type of resin, different from an assembly epoxy used in assembly of the other components of the camera, comprising characteristics of:
    lower bleed than the assembly epoxy;
    lower viscosity than the assembly epoxy;
    lower curing temperature than the assembly epoxy; and
    more sticky for loose particles than the assembly epoxy.

* * * * *